United States Patent [19]

Sieler

[11] 4,166,926

[45] Sep. 4, 1979

[54] PORTABLE LECTERN AND VOICE AMPLIFIER

[76] Inventor: George J. Sieler, 1308 W. 130th St., Gardena, Calif. 90247

[21] Appl. No.: 913,349

[22] Filed: Jun. 7, 1978

[51] Int. Cl.[2] ................................................ H05K 5/02

[52] U.S. Cl. ................................. 179/1 AT; 179/1 E; 312/233

[58] Field of Search .............. 179/1 AT, 1 E; 190/11; 312/233

[56] References Cited

U.S. PATENT DOCUMENTS

| | | | |
|---|---|---|---|
| 3,023,274 | 2/1962 | Shaw | 179/1 AT |
| 3,126,450 | 3/1964 | Neil et al. | 179/1 AT |
| 3,443,031 | 5/1969 | Bolick | 179/1 AT |

*Primary Examiner*—Kathleen H. Claffy

*Assistant Examiner*—E. S. Kemeny

*Attorney, Agent, or Firm*—Knobbs, Martens, Olson, Hubbard & Bear

[57] ABSTRACT

A compact portable lectern device having a voice amplifier contained therein which may be easily placed upon a tabletop to provide a speaker's lectern and public address system. The device includes a cabinet case having a hinged panel which when swung open from the cabinet, forms the sloping shelf of the lectern. The hinged panel is provided with a pivotally mounted lever arm support member having its fulcrum laterally displaced and provides significant stability to the lectern shelf without the need of mechanical locks or fasteners. The device is additionally provided with a detachable microphone which may be conveniently stored with the cabinet during transport.

12 Claims, 5 Drawing Figures

Fig. 1
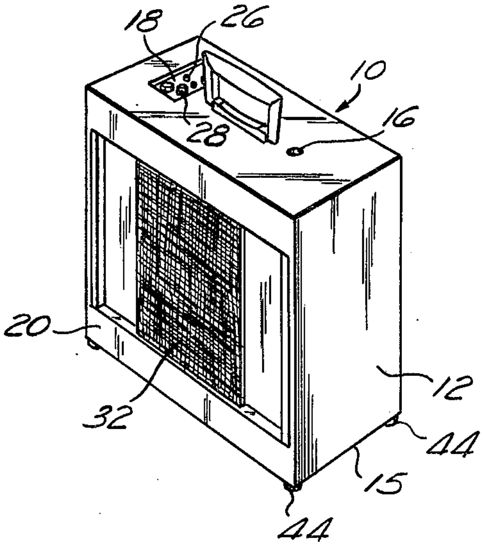
Fig. 2
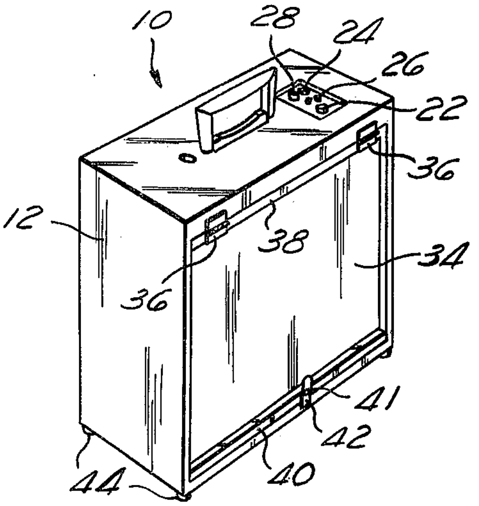
Fig. 3
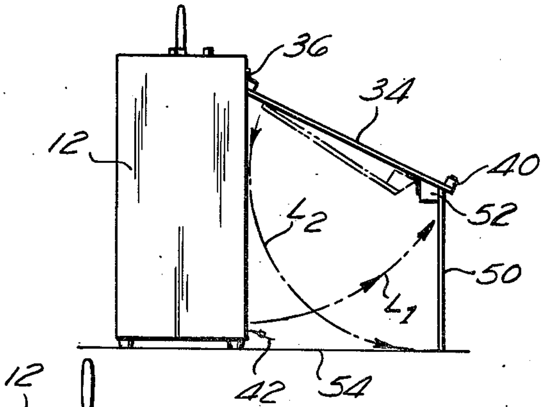
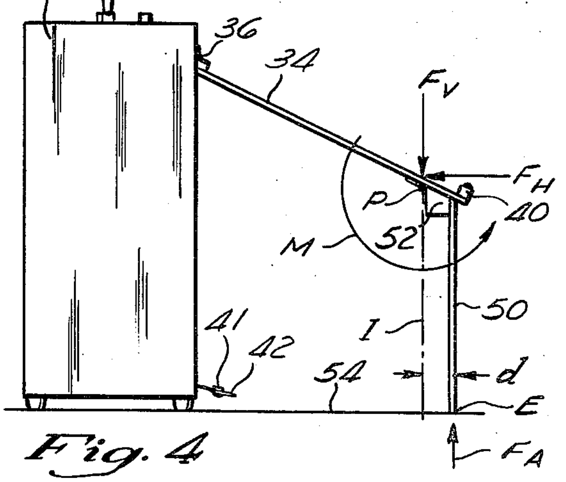
Fig. 4
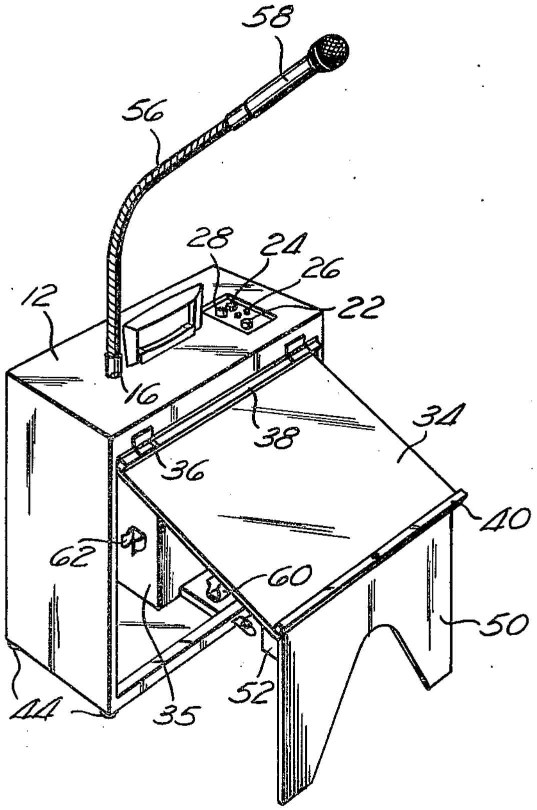
Fig. 5

PORTABLE LECTERN AND VOICE AMPLIFIER

BACKGROUND OF THE INVENTION

The present invention relates to a portable lectern and voice amplification device and, more particularly, to a portable voice amplification device having a hinged panel and offset lever arm support member which forms an inherently stable sloping shelf for use as a lectern.

With the ever-increasing number of public speaking activity and engagements, there has arisen a great need for a compact portable public address system and lectern which may be quickly and easily set up on a tabletop. Due to this need, a variety of portable amplifier lectern devices have recently been introduced on the market.

These prior art devices have typically utilized a swinging panel which when extended from the carrying case, provide a slanted or inclined surface to support notes and books of the speaker. Although these prior art designs have proven useful in their limited application, they have been fraught with support, stability, and setup problems.

The support problems of these prior art devices have been primarily caused by their inability to maintain the fixed position of the slanted lectern panel relative to the carrying case. Although these support problems are minimal when the slanted panel is only supporting books or papers, they become acute when the panel is subjected to the occasional increased force of a speaker leaning forward on the device. This increased force often causes the lectern panel to deflect and loosen at its interface with the carrying case or, in extreme cases, even buckle or collapse.

In an effort to alleviate these support problems, many prior art devices have utilized intricate support designs in which a plurality of braces or support members strengthen the lectern panel. However, these braces add substantially to the weight of the device and often cause the resulting structure to become unstable. The results of this instability is manifested in the tendency for these devices to tip over upon a minimal vertical force applied against the lectern panel.

The setup and operation of many of these prior art devices has also proven to be difficult due to the requirement of external electrical connections or intricate bracing and support designs which often require reference to an instruction manual to facilitate proper assembly and operation of the device.

SUMMARY OF THE PRESENT INVENTION

The present invention provides a simple yet novel solution to the deficiencies associated with the prior art by providing a compact portable lectern and voice amplifier which may be quickly and easily setup on a table top without the need of an instruction manual.

The device utilizes a hinged panel which when extended from the cabinet or case, provides a sturdy inclined lectern surface capable of supporting the occasional increased weight exerted by a speaker.

The lectern panel of the present invention is supported by a unique offset lever arm member which is hinge-mounted on the undersurface of the lectern panel. Due to this offset lever arm design, the lectern panel is maintained in its proper position without the use of a locking mechanism or the need for supporting the free end of the support member.

Furthermore, the device is conveniently designed with the detachable microphone which may be conveniently stored within the cabinet during transport.

Additionally, the control panel of the device is advantageously located on the exterior of the case thereby facilitating the easy access to the volume and control knobs for the speaker.

Further, due to the offset lever arm support member design, the device may be fabricated in a lightweight and compact carrying case which may be easily carried in a suitcase manner.

These and other features of the present invention will become more apparent upon reference to the drawings wherein:

FIG. 1 is a perspective view of the portable voice amplifier and lecturn of the present invention depicted in its closed position showing the top, front, and left end of the device;

FIG. 2 is a perspective view of the present invention depicted in its closed position showing the top, rear, and left end of the device;

FIG. 3 is an enlarged elevational view of the left end of the present invention illustrating the manner in which the lectern panel and offset lever arm support member is positioned from the closed to open position;

FIG. 4 is a schematic diagram of the forces acting upon the lectern panel and offset lever arm support member; and FIG. 5 is a perspective view of the present invention depicted in its open position showing the lectern panel and offset lever arm support member.

DETAILED DESCRIPTION OF THE PREFERRED EMBODIMENT

Referring to FIG. 1, there is shown the portable lectern and voice amplifier 10 of the present invention. In the preferred embodiment, the portable amplifier lectern 10 includes a rectangular case 12 typically fabricated from a thin plywood sheet having a carrying handle 14 mounted on the top surface thereof. A microphone jack 16 and amplifier control panel 18 are flush and recess mounted respectively on the top surface of the case 12 adjacent the handle 14.

The amplifier control panel 18 (better shown in FIGS. 2 and 5) is preferably provided with an on/off volume control knob 22, auxiliary microphone jack 24, auxiliary line input and output terminals 26, and an auxiliary input control knob 28.

The front panel 20 of the case 12 includes a central panel 30 having a netting or grill cloth 32 stretched thereon. This panel 20 provides a mounting surface for the speaker (not shown) and electronic amplifier (not shown) which are housed within the interior of the case 12. A replaceable battery source (not shown) is also provided within the case 12 with an access plate (not shown) located on the bottom panel 15 of the case 12.

All electrical wiring and connections (not shown) between the various electrical components as well as the speaker, amplifier, and battery supply (not shown) are encased with a cover shield 35 (as shown in FIG. 3) which prevents accidental damage to the components of the amplifier system during transport of the device 10.

Referring to FIG. 2, it may be seen that the back surface of the case 12 includes a panel 34 having a pair of strengthening beams 38 and 40 mounted across the top and bottom edges thereof and is attached to the case 12 by a pair of hinges 36. The bottom edge of the panel 34 is retained against the case 12 by a small snap 41 and leather strap 42 which prevents accidental opening of the panel 34 during transit. The case 12 is additionally provided with four elastomeric grommets 44 which are attached in the bottom corners of the case 12 and substantially decrease any slippage of the case 12 on the supporting surface.

As shown in FIGS. 3 and 4, the panel 34 includes a pivotal support member 50 having a mounting beam 52 extending across the inside surface of the panel 50 adjacent the top edge thereof. The supporting member 50 is hinge mounted on the opposite side of the interface between the beam 52 and support member 50 to the undersurface of the panel 34 thereby providing an offset lever arm design to the support member 50.

As will be explained in more detail infra, this offset lever arm design adequately supports the panel 34 and provides increased stability to the device 10 while in its open position without the requirement of using articulate bracing or mechanical locking means.

The length of the support member 50 may be formed to any desired length; the length determining the incline of the panel 34. But, in all instances, this length must be less than the length of the panel 34 to allow the support member 50 to be housed within the case 12 while in its closed position.

Referring to FIG. 3, the manner in which the hinged panel 34 is positioned to form the inclined lecturn shelf is illustrated.

First, the leather strap 42 is removed from the snap ring 41 thereby freeing the bottom edge of the panel 34 from the case 12. Using the beam 40 as a grip, the panel 34 may then be pivotally swung away from the case 12 about the hinges 36 in a direction illustrated by the dotted line $L_1$.

While the panel 34 is in an inclined position, the offset lever arm support member 50 may be pivoted from its stowed position (as indicated by the phantom lines in FIG. 3) in a downward arc to a vertical position as illustrated by the dotted line $L_2$. Note, that in this vertical position, the mounting beam 52 and support member 50 contact the undersurface of the panel 34 and act as a stop thereby preventing any further arcuate travel of the support member 50 beyond the vertical plane.

The panel 34 may then be lowered until the support member 50 contacts the supporting surface 54. In this open lectern position, the panel 34 is adequately supported by the support member 50 and is in an inherently stable position without supporting the free end of the member 50 due to the offset lever arm design of the support member 50.

This inherent stability may be easily understood by reference to FIG. 4 wherein the forces acting upon the panel 34 and support member 50 are depicted.

For the purpose of illustration, the forces acting upon the panel 34 have been indicated as concentrated forces $F_v$ and $F_h$ acting at the fulcrum point (p) of the lever arm support member 50 rather than a distributed force acting across the entire panel surface.

Due to the applied downward force $F_v$, there is an opposing force $F_a$ which acts upward through the support member 50. Additionally, due to the offset displacement (d) of the support member 50 from the fulcrum (p), a moment force (M) is generated in a counterclockwise direction about the fulcrum point (p). This moment force M urges the free end (E) of the support member 50 in an outward direction thereby aiding in the retention of the vertical orientation of the support member 50 in relation to the inclined panel 34.

As can be recognized, this moment force M continues to urge the free end of the support member 50 in an outward direction as long as the offset distance (d) is greater than zero, i.e. (until the free end (E) of the support member 50 moves inward towards the case 12 beyond the imaginary vertical plane (I)). Once the free end E of the support member 50 moves beyond the plane (I), the moment force M detracts from the stability of the design by acting in a clockwise direction thereby urging the support member 50 further inward towards the case 12.

Thus, due to the offset lever design of the support member 50, any minor inward movement of the free end (E) of the support member 50 does not affect the overall support and stability of the panel 34.

It should be noted that the greater the amount of offset (d) in proportion to the length of the support member 50, the greater the stability of the lectern panel 34 structure; the only limitation on the amount of offset being the space availability within the case 12 for stowing the support member 50 during transit.

From the above, it may be recognized that the offset lever arm support member design of the present invention adequately maintains the inclined position of the panel 34 and provides inherent stability to the lectern panel 34 without the need of articulate braces or mechanical fastening and locking mechanisms.

Referring to FIG. 5, the complete setup and operation of the portable lectern and voice amplifier of the present invention 10 may be described.

Once in the open position (i.e., with the panel 34 and support member 50 fully extended), the semirigid microphone extension 56 and microphone 58 may be connected to the microphone jack 16. In the preferred embodiment, the extension 56 is provided with a male phone jack (not shown) at both ends thereof which may be easily inserted into the female microphone jacks 16 and microphone 58 thereby eliminating any need for electrical wiring connections. For convenience, The extension 56 and microphone 58 may be stored and retained in position within the case 12 by two small spring clips 60 and 62 respectively which are mounted within the cabinet 12.

With the microphone 58 and extension 56 connected, the device 10 may be made operational by simply turning the on/off volume switch 22 in a clockwise direction. The notes and books of the speaker may then be placed on the inclined panel 34 and retained in position by the strengthening beam 40 which forms a ledge at the bottom edge thereof. Since the amplifier control panel 18 is located on the top surface of the case 12, the speaker may conveniently adjust the volume and auxiliary components of the system quickly and easily without the need of leaving the lectern.

Unlike the prior art, the present invention is quickly and easily set up without any need to resort to an instruction sheet. Thus, when panel 34 is opened, it will naturally be moved to the inclined position of a lectern table, during which movement the force of gravity will automatically cause the bottom of support member 50 to swing away from member 34 towards the supporting surface 54. Thus, once opened, the manner in which cover panel 34 is to be positioned into a stable lectern is rendered apparent to the user by the inherent operation of member 50.

What is claimed is:

1. In a portable lectern and voice amplifier, a combination comprising:

a case including a top panel, bottom panel, front panel, rear panel and two side panels;

fastening means to attach said rear panel along its top edge to said case, said fastening means allowing said rear panel to be pivotally extended away from said case into an inclined orientation; and a support member pivotally mounted to the undersurface of said rear panel by hinge means laterally displaced from the plane of said support memeber, said means permitting said member to be first swung downward into a substantially vertical position beneath said rear panel to maintain said inclined orientation of said rear panel, and then swung upward into a substantially parallel position with said undersurface of said rear panel to close said case with said support member stowed within said case.

2. The combination of claim 1 wherein said case includes an amplifier and speaker mounted within said case adjacent said front panel.

3. The combination of claim 1 wherein said case additionally includes a microphone jack located on said top panel, said jack receiving a semi-rigid extension and microphone which may be stowed within said case.

4. The combination of claim 1 wherein said rear panel includes a strengthening beam mounted to the bottom edge of said rear panel, said mounting beam serving as a grip for said rear panel while said rear panel is being extended into its inclined orientation and as a ledge to maintain the notes and books of a speaker on said panel while said panel is in said inclined position.

5. The combination of claim 1 wherein said rear panel includes a snap fastener located along the bottom edge of said panel, said snap fastener receiving a snap strap mounted to the said case to retain said rear panel against said case in a closed position.

6. A portable lectern and voice amplifier comprising:

a case including a rear panel pivotally mounted along its top edge to said case;

a speaker and amplifier housed within said case;

a support member pivotally mounted to the undersurface of said rear panel along an axis laterally displaced from the plane of said member and positioned adjacent one end of said rear panel;

said rear panel and said support member having a first position wherein said rear panel is maintained against said case in a vertical plane while said member is stowed within said case in a substantially parallel orientation to said rear panel; and a second position wherein said rear panel is pivoted away from said case into an inclined plane while said support member is pivoted through a downward arc into a substantially vertical position.

7. The portable lecturn and voice amplifier of claim 6 wherein said second position provides an inherently stabile lecturn shelf.

8. The portable lecturn and voice amplifier of claim 6 wherein said speaker is flush mounted to the front panel of said case.

9. The portable lecturn and voice amplifier of claim 6 wherein said case includes a microphone jack mounted on the top surface of said case.

10. The portable lecturn and voice amplifier of claim 6 wherein said amplifier includes a replaceable battery source.

11. The portable lecturn and voice amplifier of claim 6 wherein said rear panel includes a supporting beam along the bottom edge of said rear panel, said supporting beam serving as a grip for said panel while in said first position and a stop for notes and books of a speaker while in said second position.

12. The portable lecturn and voice amplifier of claims 6, 7, 8, 9, 10 or 11 wherein the force of gravity automatically moves one end of said support member away from said rear panel toward its vertical support position.

* * * * *